United States Patent [19]

Kubota

[11] Patent Number: 4,849,973
[45] Date of Patent: Jul. 18, 1989

[54] TEST SYSTEM FOR RANDOM ACCESS MEMORY

[75] Inventor: Katsuhisa Kubota, Kawasaki, Japan

[73] Assignee: Fujitsu Limited, Kawasaki, Japan

[21] Appl. No.: 98,144

[22] Filed: Sep. 18, 1987

[30] Foreign Application Priority Data

Sep. 19, 1986 [JP] Japan ................................ 61-223298

[51] Int. Cl.$^4$ ............................................. G06F 11/00
[52] U.S. Cl. ........................................ 371/21; 365/201
[58] Field of Search ...................... 371/15, 16, 25, 21; 365/201, 200

[56] References Cited

U.S. PATENT DOCUMENTS 4,430,735  2/1984  Catiller ................................. 371/28
4,519,077  5/1985  Amin ..................................... 371/21
4,755,970  7/1988  Schrenk ............................... 365/201

Primary Examiner—Michael R. Fleming
Attorney, Agent, or Firm—Staas & Halsey

[57] ABSTRACT

A test system for a random access memory includes a clock pulse width varying unit for varying a pulse width of driving pulses for a random access memory. A first latch is connected to an address input circuit of the random access memory for receiving the output clock signal of the clock pulse width varying unit and latching an address input signal at the leading edge of the output clock signal. A second latch is connected to a data output circuit of the random access memory for latching a data output signal. Both the first and second latches are supplied with the same clock signals from the clock pulse width changing unit, and a comparison unit is connected to a data output circuit of the random access memory for comparing the output of the random access memory with a predetermined expectation value. The output of the comparison unit is latched by the trailing edge of the clock pulse in the second latch.

7 Claims, 7 Drawing Sheets

TEST SYSTEM FOR RANDOM ACCESS MEMORY

BACKGROUND OF THE INVENTION

1. Field of the Invention

The present invention relates to a test system for a random access memory (RAM). The system according to the present invention is concerned with a RAM testing system which is provided with latch units at both the input side and the output side of the RAM. A measurement of the address access time by the widths of clock pulses can be carried out with a high precision.

2. Description of the Related Art

In general, in the prior art method of testing the access time of RAM's, signals are delivered to address input pins of a RAM from drivers of an LSI tester and the outputs of the RAM are fed to a comparator, thus implementing the measurement of the address access time. In this case the address inputs of the RAM are equivalent to a clock input of the latch when an input latch is provided.

In the conventional RAM testing system, the output of an oscillator is fed to each delay circuit and set signals are also delivered to the delay circuits to generate a clock signal No. 1, and a clock signal No. 2. The clock signal No. 1, is fed to input side flip-flop circuits and address signals are fed to the flip-flop circuits to send the output of the flip-flop circuits to the RAM elements to be tested. On the other hand, the clock signal No. 2 is fed to the output side flip-flop circuits. Each output of the output side flip-flop circuits is fed to comparators to which the expectation value is applied, respectively, and the outputs of the comparators are sent to a discriminator.

In the device of FIG. 1, two clock signals having different delay times are supplied to the input side flip-flop circuit and to the output side flip-flop circuit through the terminal pin PIN-A and through the terminal pin PIN-B, respectively.

Therefore, a problem arises in that an error occurs due to the difference in the timing of the signals through different terminal pins of the LSI tester, and an address access time of a RAM responsive to the clock pulse can not be accurately measured.

SUMMARY OF THE INVENTION

It is an object of the present invention to provide an improved test system for a RAM for measuring the address access time of a RAM with a high precision.

Accordingly, in accordance with the present invention, there is provided a test system for a random access memory including: clock pulse width varying means for varying a pulse width of driving pulses for a random access memory; a first latch means connected to an address input circuit of the random access memory for receiving the output clock signal of the clock pulse width varying means and latching an address input signal at the leading edge of the output clock signal; a second latch means connected to a data output circuit of the random access memory for latching a data output signal, both the first and second latch means being supplied with the same clock signals from the clock pulse width varying means; and comparison means connected to a data output circuit of the random access memory for comparing the output of the random access memory with a predetermined expectation value corresponding to address access time of the random access memory; the output of the comparison means being latched by the trailing edge of the clock pulse in the second latch means.

The present invention utilizes only one channel and uses the access time between the input and output latches of a RAM to be tested, thus remarkably reducing the skew.

DESCRIPTION OF THE PREFERRED EMBODIMENTS

Before describing the preferred embodiments of the present invention, a prior art test system for RAMs is described with reference to FIG. 1.

Figure 1:
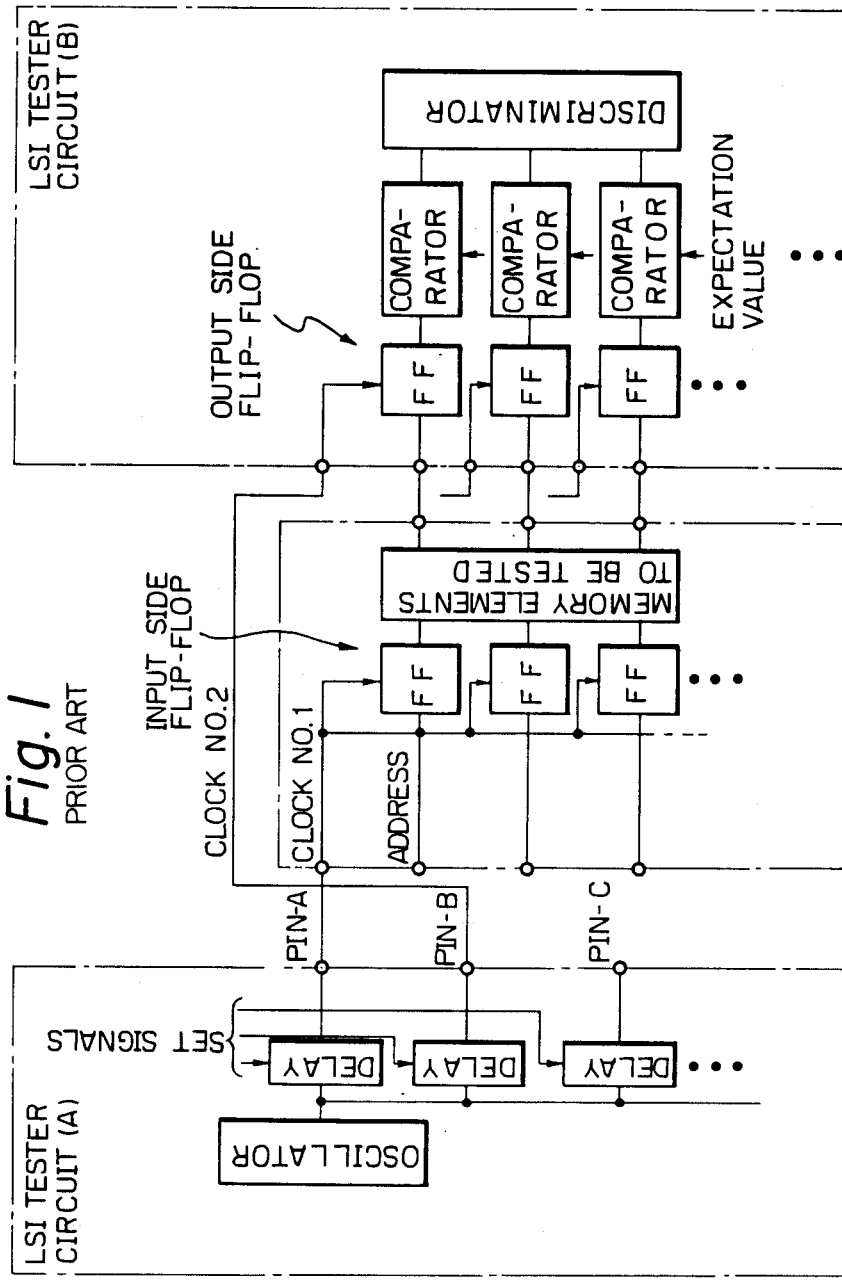
FIG. 1 is a block diagram of a prior art RAM tester.

In FIG. 1, the output of an oscillator is fed to each delay circuit and set signals are delivered to the delay circuits to generate a clock signal No. 1, and a clock signal No. 2. The clock signal No. 1 is fed to the input side flip-flop circuits and address signals are fed to the flip-flop circuits to send the output of the flip-flop circuits to memory elements to be tested. On the other hand, the clock signal No. 2 is fed to the output side flip-flop circuits. Each output of the output side flip-flop circuits is fed to each of the comparators to which the expectation value is applied, respectively, and the outputs of the comparators are sent to a discriminator.

In the system of FIG. 1, two clock signals having different delay times are supplied to the input side flip-flop circuit and to the output side flip-flop circuit through the terminal pin PIN-A and through the terminal pin PIN-B, respectively.

A test system for a RAM according to an embodiment of the present invention will now be described with reference to FIG. 2.

Figure 2:
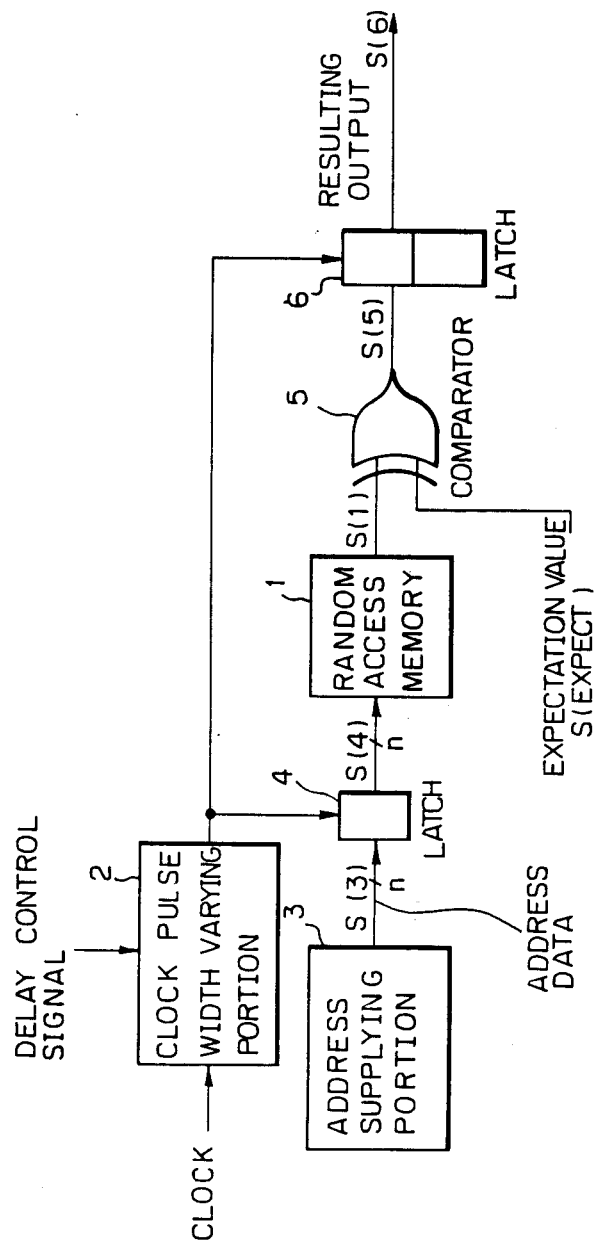
FIG. 2 is a block diagram of a test system for RAM in accordance with an embodiment of the present invention.

In FIG. 2, a clock pulse is sent to a clock pulse width varying portion 2, where a delay control signal is delivered to vary the width of the clock pulse. The output of the clock pulse width varying portion 2 is sent to an address latch 4 and an output latch 6 simultaneously. The address latch 4 samples new address signals by a leading edge of the clock pulse and the output latch 6 is latched by a trailing edge of the clock pulse (Sample is carried out also from the leading edge timing), thus comparing the output of the RAM 1 with the output expectation value responsive to the address access time of the RAM 1 by a comparator 5 or exclusive OR circuit. The exclusive-OR gate will provide an output (logic 1) only when the two inputs are not alike. This means that the two inputs must have a different logic level in order for a logic 1 output to occur. Note that for the exclusive-OR gate, an output (logic 1) results only in steps when two inputs are "0", "1" or "1", "0", i.e., where the inputs have a different logic state.

The exclusive OR gate is used in binary word detection. For example, when two input words are identical, the output is low. If the words are not identical, the output is high. This type of word comparison is very helpful when searching through a large amount of data or words for a particular word. The number of times the word occurs can be counted with this circuit, by providing a frequency count of the word. The address access time of the RAM can be measured with high precision by the comparator output. Moreover, the pulse width of the clock pulse can be counted by measuring the clock frequency by a frequency counter.

By using a detailed circuit diagram of the important parts of FIG. 2, the embodiment of the present invention will be described in detail with reference to FIG. 3.

Figure 3:
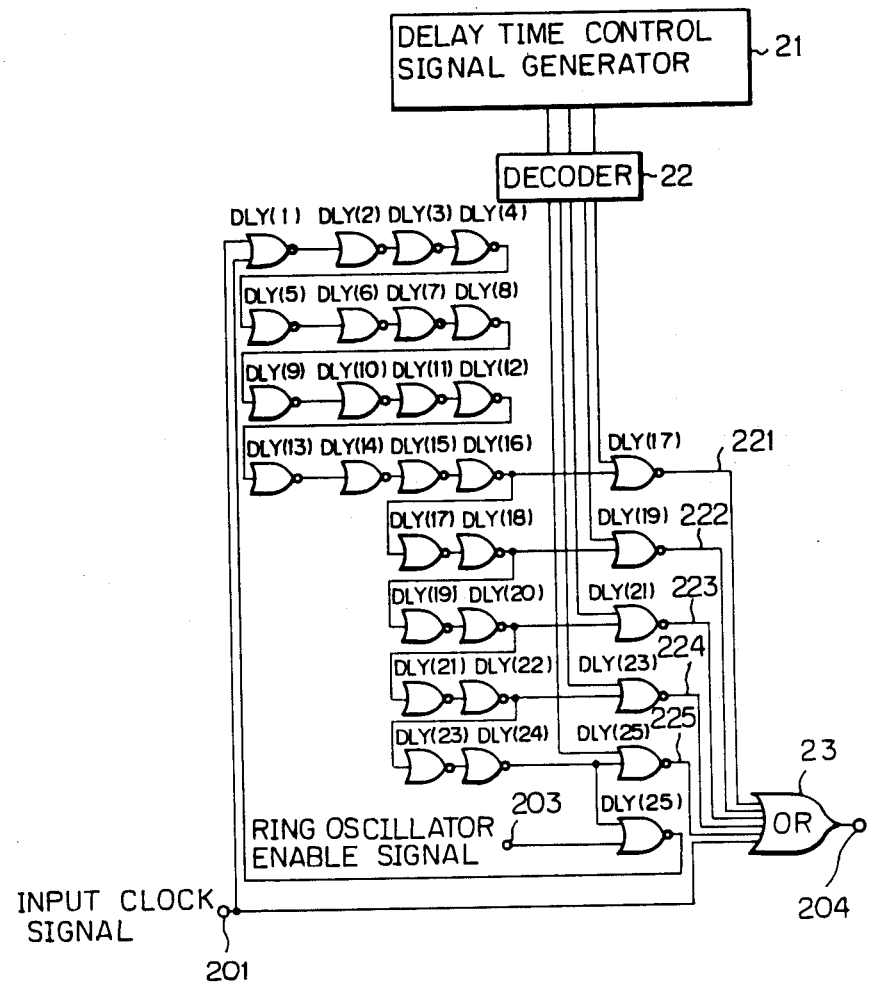
FIG. 3 is a block diagram of the structure of a clock pulse width varying portion in the system of FIG. 2.

FIG. 3 is a detailed circuit diagram of a clock pulse width varying portion 2 in FIG. 2. The clock pulse width varying portion is composed of a variable delay circuit by twenty-five stages of ring oscillators and a chopper circuit formed which determines the pulse width in response to the delay time. Based on such a constitution, the frequency of the output clock is measured to determine its pulse width with a high accuracy.

A clock from an LSI tester is input to a terminal 201, and a ring oscillator enable signal is input to a terminal 203. The clock pulse, which is controlled to a predetermined pulse width, is output from a terminal 204 and sent to an address latch 4 and an output latch 6 (FIG. 2). A delay time control signal generator 21 generates a delay time control signal and sends it to a decoder 22, and then after a decoding operation, the output of the decoder 22 is sent to five NOR circuits No. 17, 19, 21, 23 and 25.

Each numeral of the NOR circuits DLY (1) to DLY (25) represents a relative amount of delay of a clock signal. Therefore, when the ring oscillator enable signal at a terminal 203 is LOW and a signal is sent which selects a path 221 by a decoder 22, the delay time $T_{d25}$ of the twenty five stages of ring oscillator can be measured at a frequency counter (not shown) which is connected to the output of the OR circuit 23. As a result, when the data paths 221 to 225 are selected respectively, the chopped pulse width $t_{WC}$ can be calculated. For example, in the case of the data path 221, $$t_{WC} = T_{d25} \times (17/25) = T_{p1}$$

The same holds true for the paths 222 to 225, $$T_{p2} = T_{d25} \times (19/25)$$

$$T_{p3} = T_{d25} \times (21/25)$$

$$T_{p4} = T_{d25} \times (23/25)$$

$$T_{p5} = T_{d25}$$

The operating test of a RAM is carried out so that the standard value $T_{AACK}$ for checking an address access time $T_{AA}$ of a RAM 1 may be previously determined and the data path having the condition $$T_{p(n-1)} < T_{AACK} < T_{pn}$$

may be utilized.

Therefore, irrespective of the precision of the clock pulse width given by an LSI tester, a clock having a pulse width with a good precision can be output by a clock pulse width varying portion 2 (FIG. 2). That is, in response to the pulse width of a clock pulse output from the clock pulse width varying portion 2, the address access time $T_{AA}$ of the RAM 1 can be precisely measured.

Figure 4:
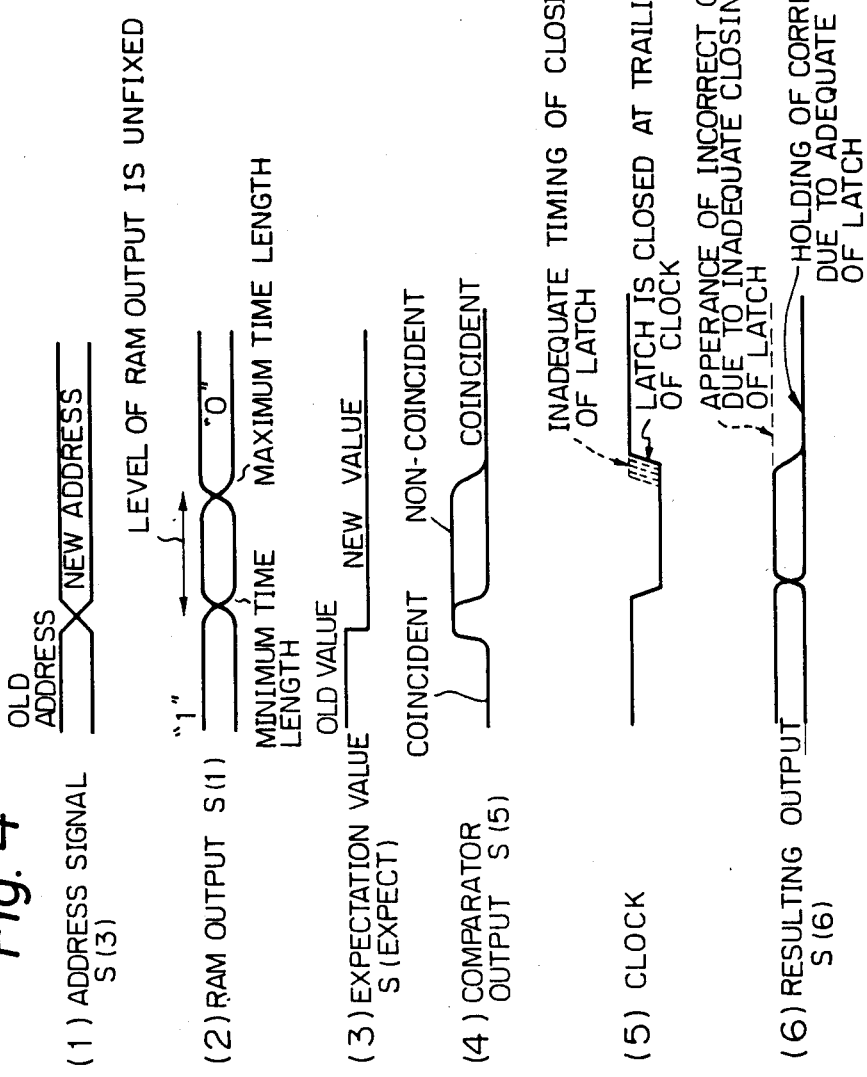
FIG. 4 is a waveform diagram showing the signals appearing in the portions of the system of FIG. 2.
Figure 5:
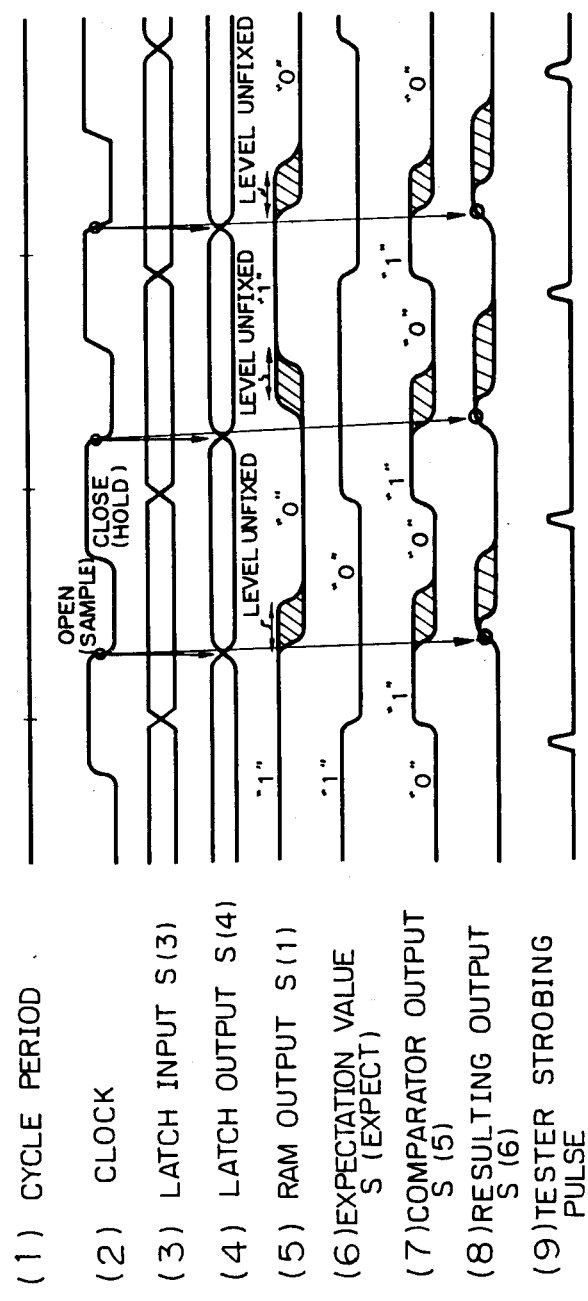
FIG. 5 is a waveform diagram showing the signals appearing in the principal parts in the system of FIG. 2.

FIG. 4 is a waveform diagram of each portion in FIG. 2. In FIG. 5, item (1) denotes an address signal S (3) in FIG. 2, item (2) a RAM output S (1), item (3) an expectation value S (EXPECT), item (4) a comparator output S (5), item (5) a clock, and item (6) a resulting output S (6), respectively.

First, address data is applied to an address latch 4 to produce an address signal. The address signal is applied to a RAM 1 to output the data. The waveform of an old address is changed to that of a new address, and accordingly, the RAM output is changed from "1" to "0". In the region of a minimum time to a maximum time, the level of RAM output is not fixed. Correspondingly, the output expectation value is also changed from an old value to a new value. The changing point of the expectation value is a little earlier than the changing point of the address signal. In response to the changing point of the output expectation value, the output of a comparator circuit varies from a coincident region to a non-coincident region and returns to the coincident region.

When a common clock pulse is supplied to the address latch 4 and the output latch 6, the address latch 4 samples a new address signal by a leading edge of the clock pulse, and the output latch 6 is devised to close the latch by a trailing edge of the clock pulse, thus comparing the RAM output with the output expectation value responding to the address access time of the RAM. For example, when the latch output at the output side is changed from "1" to "0", if the latch is closed, and if the latch is definite, the "0" output is produced. As a result, the address access time of the RAM can be measured with a high accuracy.

After the output of the RAM 1 and the output expectation value are compared, the result of the comparison is latched by the trailing edge of the clock pulse at the output latch 6. If the clock coincides with the resultant output of the latch, the output is "0".

Figure 6:
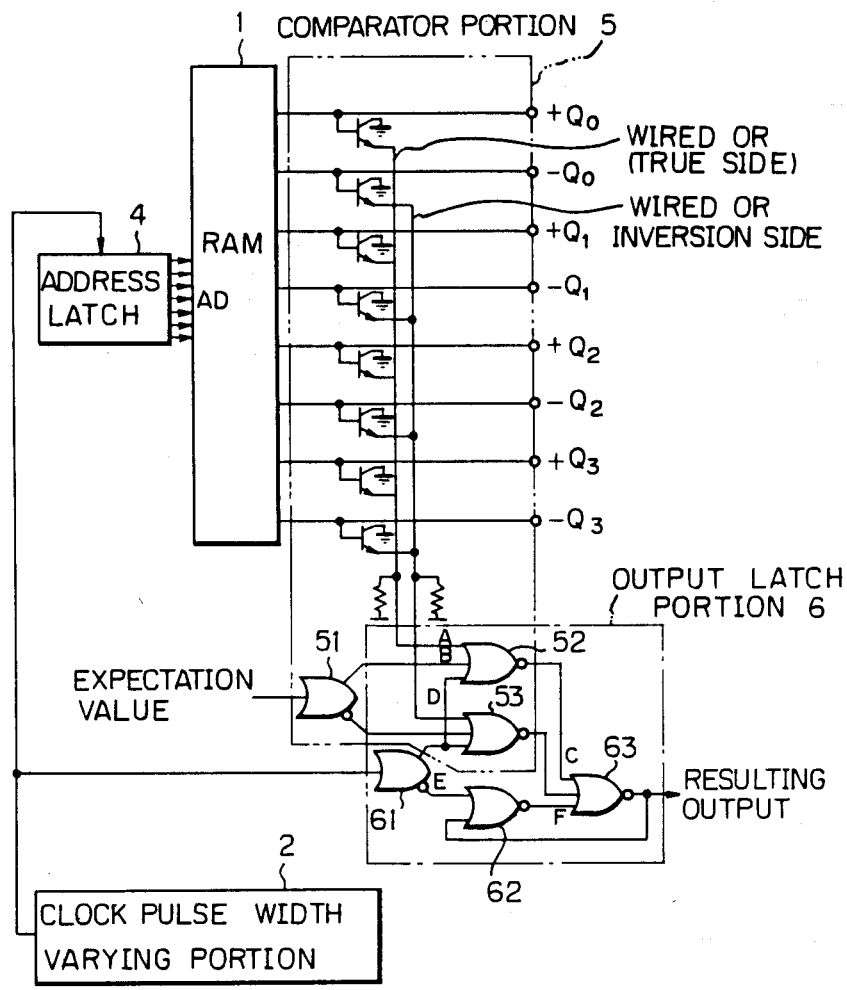
FIG. 6 is a block diagram of the structure of a comparator portion and an output latch portion in FIG. 2 of the present invention.

The cells within the RAM 1 are selected by the address output of the address latch 4 and the output responsive thereto is fetched from the RAM 1. For a period, the output and the output expectation value are compared by the NOR circuits 51, 52, 53 (FIG. 6). During that time, the NOR circuits 62, 63 are left open, the output latch portion 6 is closed by a trailing end of the clock pulse, and it is determined whether or not the output of the RAM has reached the value of the output expectation value. By varying the pulse width of the clock pulse, the time period from the opening time to the closing time of the address latch 4 and the output latch 6, that is, the time duration response to the pulse width of the clock pulse, enables the address access time of the RAM to be measured.

FIG. 5 is a waveform diagram showing the signals appearing in the principal parts in the device of FIG. 2. In FIG. 5, item (1) denotes a cycle period, item (2) a clock, item (3) a latch input S (3) in FIG. 2, item (4) a latch output S (4), item (5) a RAM output S (1), item (6) an expectation value S (EXPECT), item (7) a comparator output S (5), item (8) a resulting output S (6), and item (9) a tester strobing pulse, respectively.

In each cycle period, a clock is generated. Responding to the latch input S (3) and the latch output S (4), the RAM output S (1) is generated, but the level of RAM output is not fixed from the minimum time length to the maximum time length. When the expectation value changes from "1" to "0", the comparator output is generated, and responding to the open and close state of a clock, the resulting output S (6) is obtained.

FIG. 6 is a detailed connection diagram of a comparator portion and an output latch portion of FIG. 2 of the present invention. In an embodiment of FIG. 6, the output of RAM 1 is of 4 bits, which possess a plurality of complementary outputs (+Q, −Q). The RAM has generally only either output (as an example, +Q), and has a complementary output (in this case, −Q), within the RAM.

In FIG. 2, the output terminal of clock pulse width varying portion 2 is connected to an address latch 4 and output latch 6. The output of the address latch 4 is connected to an address input (AD) of the RAM 1. The outputs of the address accessed RAM 1 are obtained respectively as each set of complementary outputs ($+Q_0$ to $+Q_3$, $(-Q_0)$ to $(-_3)$), and after a wired OR operation, are connected to the first input of the NOR circuits 52 and 53.

The comparator portion 5 is composed of eight emitter follower type transistors 501–508 and three NOR circuits 51, 52 and 53. The eight outputs of the RAM 1 are divided into true side wires OR outputs ($+Q_0$, $+Q_1$, $+Q_2$, and $+Q_3$) and inversion side wired OR outputs ($-Q_0$, $-Q_1$, $-Q_2$, and $-Q_3$) to send each first input to the NOR circuits 52 and 53.

The output expectation value is input to a NOR circuit 51, the non-inverted output is sent to a second input terminal of the NOR circuit 52, and the inverted output is sent to a second input terminal of the NOR circuit 53, respectively. The non-inverted output of the NOR circuit 61 is connected to each third input of the NOR circuits 52 and 53, and the inverted output is connected to the first input of the NOR circuit 62. The outputs of the NOR circuits 52, 53 and 62 are respectively connected to the first, second and third input terminals of a NOR circuit 63. The output of the NOR circuit 63 is connected to the second input of the NOR circuit 62 and, at the same time, acts as a resulting output of the output latch portion 6.

Figure 7:
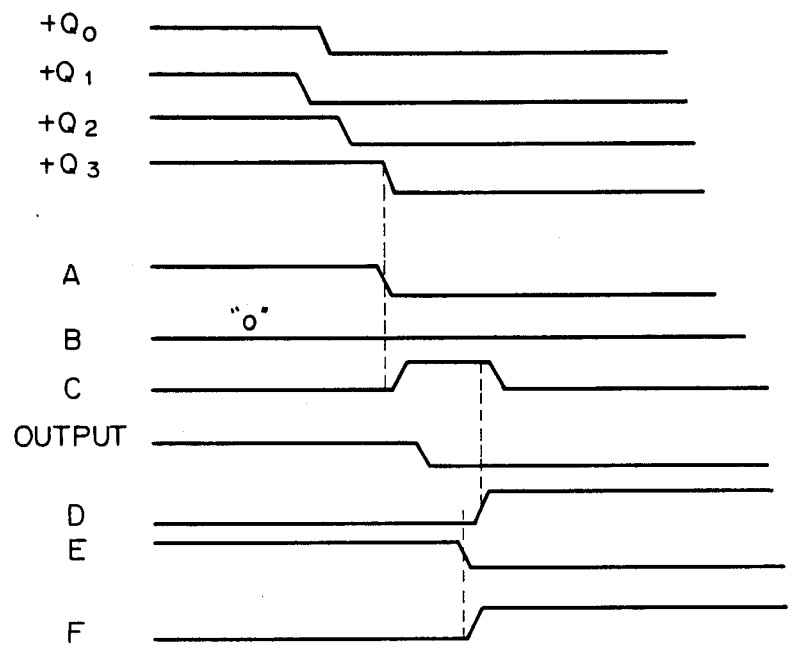
FIG. 7 is a block diagram of the waveforms at the output parts of the comparator portion and at the points A, B, . . . E, and F of the output latch portion.

FIG. 7 is a waveform diagram of each portion of FIG. 6. After four true side wires OR's ($+Q_0$, $+Q_1$, $+Q_2$ and $+Q_3$) are connected to the NOR circuit 52, the first input A is changed from "1" to "0" and the second input B is constantly equal to "0". The output of the NOR circuit 52 is shown by a waveform C and the resultant output is shown by a waveform output. The non-inverted output of the NOR circuit 61 is shown by the waveform D and the inverted output by the waveform E. The output of the NOR circuit 62 (waveform F) shows the variation from a LOW level to a HIGH level and the latch is closed.

What is claimed is:

1. A test system for a random access memory having an address input circuit and a data output circuit, comprising:

clock pulse width varying means, coupled to receive a clock signal, for varying a pulse width of pulses in the clock signal and for providing an output clock signal;

first latch means, connected to the address input circuit of the random access memory and said clock pulse width varying means, for latching an address input signal at the leading edge of the output clock signal;

second latch means, connected to the data output circuit of the random access memory and said clock pulse width varying means, for latching a data output signal at the trailing edge of the output clock signal, said first and second latch means both being supplied with the output clock signal from said clock pulse width varying means; and comparison means, connected to the data output circuit of the random access memory, for comparing the output of the random access memory with a predetermined expectation value corresponding to an address of the random access memory.

2. A system according to claim 1, wherein said clock pulse width varying means comprises means for providing delay value control signals, and a variable delay circuit formed by a ring oscillator circuit and responsive to an input clock signal, the delay value of said variable delay circuit being controlled by the delay value control signals.

3. A system according to claim 1, wherein said comparison means comprises:

transistors coupled to receive true output signals and inversion output signals from the random access memory, said transistors having true output sides and inversion output sides;

a first wired OR circuit connected to the true output sides of said transistors controlled by the true output signals of the random access memory;

a second wired OR circuit connected to the inversion output sides of said transistors controlled by the inversion output signals of the random access memory;

a first NOR gate responsive to a predetermined expectation value signal for delivering a true output and an inversion output;

a second NOR gate coupled to said first NOR gate and said first wired OR circuit, said second NOR gate responsive to the output of said first wired OR circuit and the true output of said first NOR gate; and a third NOR gate coupled to said second wired OR circuit and said first NOR gate, said third NOR gate responsive to the output of said second wired OR circuit and the inversion output of said first NOR gate; and wherein said second latch means comprises:

a fourth NOR gate, coupled to said clock pulse width varying means and responsive to the output of said clock pulse width varying means, for delivering a true output and an inversion output;

said second NOR gate;

said third NOR gate;

a fifth NOR gate coupled to said fourth NOR gate and responsive to the inversion output of said fourth NOR gate; and a sixth NOR gate responsive to the outputs of said second, third and fifth NOR gates, the true output of said fourth NOR gate being supplied to said second and third NOR gates, the output of said sixth NOR gate being supplied to said fifth NOR gate.

4. A system according to claim 1, wherein said clock pulse width varying means is incorporated in the RAM.

5. A system according to claim 1, wherein said clock pulse width varying means is incorporated in an LSI tester.

6. A test system for a random access memory, said test system coupled to receive a clock sigal and an expectation value signal, said test system comprising:
   clock pulse width varying means, coupled to receive the clock signal, for varying the pulse width of the clock signal and for providing an output clock signal;
   means for supplying address data;
   first latch means, coupled to said clock pulse width varying means, said address data supplying means and the random access memory, for latching the address data in said first latch means at the leading edge of the output clock signal and for providing an address signal to the random access memory to cause the random access memory to output data;
   comparison means, coupled to the random access memory and coupled to receive the expectation value signal, for comparing the data output by the random access memory with the expectation value signal corresponding to the accessed address of the random access memory and for producing a comparison output; and
   second latch means, coupled to said comparison means and said clock pulse width varying means, for latching the comparison output of said comparison means at the trailing edge of the output clock signal.

7. A test system according to claim 6, wherein said clock pulse width varying means comprises:
   means for providing delay value control signals; and
   a variable delay circuit formed by a ring oscillator circuit and responsive to the clock signal, the delay value of said variable delay circuit being controlled by the delay value control signals.

* * * * *

UNITED STATES PATENT AND TRADEMARK OFFICE
CERTIFICATE OF CORRECTION

PATENT NO. : 4,849,973
DATED : JULY 18, 1989
INVENTOR(S) : KATSUHISA KUBOTA

It is certified that error appears in the above-identified patent and that said Letters Patent is hereby corrected as shown below:

Col. 2, line 22, "block" should be --waveform--; and "of" should be --for--.

Col. 3, line 21, after "circuit" insert --formed--;
       line 22, delete "formed".

Col. 4, line 8, "FIG. 5," should be --FIG. 4,--;
       line 58, "response" should be --responsive--.

Col. 5, line 23, "(- --$_3$))," should be --(-$Q_3$)),--;
       line 48, "wires" should be --wired--.

Col. 7, line 5, "sigal" should be --signal--.

Signed and Sealed this

Twelfth Day of June, 1990

Attest:

HARRY F. MANBECK, JR.

Attesting Officer

Commissioner of Patents and Trademarks